United States Patent
Ikushima

(10) Patent No.: US 8,439,227 B2
(45) Date of Patent: May 14, 2013

(54) VISCOUS LIQUID MATERIAL DISCHARGING METHOD AND APPARATUS

(75) Inventor: Kazumasa Ikushima, Mitaka (JP)

(73) Assignee: Musashi Engineering, Inc., Mitaka-shi, Tokyo (JP)

( * ) Notice: Subject to any disclaimer, the term of this patent is extended or adjusted under 35 U.S.C. 154(b) by 458 days.

(21) Appl. No.: 12/595,150

(22) PCT Filed: Apr. 10, 2008

(86) PCT No.: PCT/JP2008/000936
§ 371 (c)(1),
(2), (4) Date: Dec. 17, 2009

(87) PCT Pub. No.: WO2008/126414
PCT Pub. Date: Oct. 23, 2008

(65) Prior Publication Data
US 2010/0181337 A1    Jul. 22, 2010

(30) Foreign Application Priority Data
Apr. 10, 2007    (JP) .................. 2007-102729

(51) Int. Cl.
*B67B 7/00*    (2006.01)
*G01F 11/00*    (2006.01)
*B65G 33/24*    (2006.01)

(52) U.S. Cl.
USPC ............ 222/1; 222/413; 222/263; 222/333; 222/373

(58) Field of Classification Search .......... 222/263, 222/333, 372, 373, 394, 399, 410–412, 413
See application file for complete search history.

(56) References Cited

U.S. PATENT DOCUMENTS
3,408,051 A * 10/1968 McWhirter ............... 366/177.1
5,028,373 A *  7/1991 Taniguchi et al. ......... 264/328.1
(Continued)

FOREIGN PATENT DOCUMENTS
EP    1331080 A2    7/2003
JP    62-201671 A    9/1987
(Continued)

OTHER PUBLICATIONS
Supplementary European Search Report dated Mar. 23, 2010, issued in corresponding European Patent Application No. EP08738546.
(Continued)

*Primary Examiner* — Kevin P Shaver
*Assistant Examiner* — Patrick M Buechner
(74) *Attorney, Agent, or Firm* — Westerman, Hattori, Daniels & Adrian, LLP

(57) ABSTRACT

A viscous liquid material discharging method and apparatus can minimize the problem of wear of a sealing member due to friction, and minimize a rotational force required at the time of starting discharge of a highly-viscous liquid material. The apparatus includes a screw having a helical blade which is axially provided over a surface of a rod-like member, a rotation driving mechanism for rotating the screw, a main body having a screw insertion bore in which the screw is inserted, a liquid material supply port formed in a lateral side of the screw insertion bore, and a liquid material supply flow passage communicating with the liquid material supply port, a sealing member which is disposed in the screw insertion bore and through which the screw penetrates, and a nozzle mounted to the main body and communicating with the screw insertion bore.

17 Claims, 5 Drawing Sheets

U.S. PATENT DOCUMENTS

| | | |
|---|---|---|
| 5,564,606 A | 10/1996 | Engel |
| 5,984,147 A | 11/1999 | Van Ngo |
| 6,234,358 B1 * | 5/2001 | Romine et al. ................ 222/413 |
| 6,349,858 B1 * | 2/2002 | Kingsford et al. ......... 222/400.7 |
| 6,386,396 B1 | 5/2002 | Strecker |
| 6,983,867 B1 | 1/2006 | Fugere |
| 2003/0140671 A1 | 7/2003 | Lande et al. |
| 2006/0127584 A1 | 6/2006 | Lande et al. |

FOREIGN PATENT DOCUMENTS

| | | |
|---|---|---|
| JP | 5-11513 B2 | 2/1993 |
| JP | 2002-326715 A | 11/2002 |
| JP | 2006-053196 A | 2/2006 |
| WO | 2007-097277 A1 | 8/2007 |
| WO | 2008-069000 A1 | 6/2008 |

OTHER PUBLICATIONS

International Search Report of PCT/JP2008/000936, mailing date of Jul. 8, 2008.

* cited by examiner

→ 301

VISCOUS LIQUID MATERIAL DISCHARGING METHOD AND APPARATUS

TECHNICAL FIELD

The present invention relates to a method and an apparatus for discharging a viscous liquid material in a fixed quantity. More particularly, the present invention relates to a viscous liquid material discharging method and apparatus which can reduce loads imposed on components, such as a sealing member and a motor.

In this description, the term "viscous liquid material" means a liquid material with viscosity of several hundreds centipoises to several millions centipoises, unless otherwise specified.

BACKGROUND ART

There is known a screw type method of rotating a screw having a helical blade, which is axially provided over a surface of a rod-like member, such that the blade feeds a liquid material to an discharging port with rotation of the screw, to thereby discharge the liquid material. The screw type method is widely used, in particular, to discharge a highly-viscous liquid material and a liquid material containing a filler.

A known screw type discharging apparatus is disclosed, for example, in Japanese Patent Publication No. Hei 5-11513 (Patent Document 1). Patent Document 1 discloses an discharging apparatus comprising a cylinder in which a screw rod is inserted, the cylinder having a nozzle projected at the liquid outlet side and a supply hole formed, for introducing a liquid, on its lateral surface opposite to the liquid outlet side, and a reservoir coupled to the supply hole. The liquid introduced in a pressurized state through the supply hole is fed to the liquid outlet side with rotation of the screw rod, and the liquid is discharged onto the surface of a workpiece from the nozzle as per setting. Thus, a generally known method is designed to introduce the liquid in a pressurized state to the apparatus and to discharge the liquid with the screw rotation.

Further, as a method and an apparatus for accurately discharging a liquid containing a filler, the applicant has proposed a liquid material discharging method and apparatus comprising a screw having a helical vane which is provided on a cylinder surface to axially extend from a cylinder distal end, a rotation driving mechanism for rotating the screw, a main body having a liquid inlet port to which a liquid material is supplied, a screw penetrating bore through which the screw penetrates, and a housing which covers a distal end of the screw at the discharging port side thereof, and a nozzle mounted to a distal end of the housing and communicating with the interior of the housing, wherein a gap is left between the screw and an inner wall surface of the housing (Patent Document 2).

Patent Document 1: Japanese Patent Publication No. Hei 5-11513
Patent Document 2: Japanese Patent Laid-Open No. 2002-326715

DISCLOSURE OF THE INVENTION

Problems to be Solved by the Invention

In the known screw type discharging apparatus, a high pressure has to be applied in order to feed a highly-viscous liquid material or a liquid material containing a filler from the reservoir under pressure. Also, as the size of the reservoir increases (particularly, as the diameter of the reservoir increases), the length of a flow passage is prolonged correspondingly, and therefore an even higher pressure has to be applied. That type of apparatus includes a sealing member which is fitted over a screw shaft to prevent the liquid material from leaking to the motor side. Accordingly, increasing the pressure for feeding the liquid leads to the necessity of increasing a contact surface pressure between the sealing member and the screw shaft, thus causing a problem that wear is accelerated due to friction. In particular, when the liquid material contains a filler, wear is further accelerated.

The sealing member serves to rotatably hold the screw in a close contact relation while preventing intrusion of the liquid material. However, the liquid material may enter, though little by little, a gap between the sealing member and the screw. Depending on the type of the liquid material (e.g., in the case of the type curing with the lapse of time like an adhesive), sliding resistance of the screw is so increased as to impede rotation of the motor. In the worst case, the motor may be stopped. On the other hand, because of the above-mentioned problem of wear, the problem of the intrusion of the liquid material cannot be overcome just by increasing the contact surface pressure.

In addition, when a liquid contact section is constituted by a plurality of components, a sealing member needs to be disposed for each joined portion to prevent leakage of the liquid material. This means that the problem of wear occurs at a plurality of locations. Thus, minimizing the number of sealing members disposed is also a problem to be overcome.

Taking into account the above-mentioned problems that the sliding resistance of the screw is increased if the liquid material enters the gap between the sealing member and the screw, it is required to select a motor having a large rotational force. Particularly, when the liquid material has high viscosity, a large rotational force is required at the time of causing the liquid material to start to flow.

Meanwhile, when the apparatus has a structure including an air relief port as in Patent Document 1, a strong thrust force cannot be given to the liquid material. It is hence difficult to discharge the viscous liquid material.

An object of the present invention is to provide a viscous liquid material discharging method and apparatus which can solve the problems mentioned above.

Means for Solving the Problems

In the known screw type discharging apparatus, as described above, a high pressure is applied to the liquid material in the reservoir so that the liquid material is fed under pressure. If any space is present in a screw insertion bore in which the screw is inserted, the pressure in the space affects the pressure in the screw insertion bore. Taking into account such an influence, in Patent Document 2, the sealing member is arranged such that its lower surface is positioned to be coincident with an upper surface of a flow passage communicating with the screw insertion bore, in order to minimize the space in the screw insertion bore.

In contrast, the inventor has succeeded in solving the above-mentioned problems attributable to the provision of the sealing member based on the conception of forming a space, which serves to prevent the screw insertion bore from being filled with the liquid, in an upper portion of the screw insertion bore and utilizing the pressure in such a liquid-arresting space.

A first aspect of the present invention resides in a viscous liquid material discharging method comprising the steps of preparing an apparatus comprising a screw having a helical blade which is axially provided over a surface of a rod-like member, a rotation driving mechanism for rotating the screw, a main body having a screw insertion bore in which the screw is inserted, a liquid material supply port formed in a lateral side of the screw insertion bore, and a liquid material supply flow passage communicating with the liquid material supply port, a sealing member which is disposed in the screw insertion bore and through which the screw penetrates, and a nozzle mounted to the main body and communicating with the screw insertion bore; forming a liquid-arresting space above the liquid material supply port in the screw insertion bore; and supplying the liquid material to the screw insertion bore while avoiding the sealing member from being wetted with the liquid material, and rotating the screw in a forward direction to discharge the liquid material from the nozzle.

According to a second aspect of the present invention, in the first aspect of the present invention, flow resistance in the liquid-arresting space is set to be larger than flow resistance in part of the screw insertion bore, which is positioned below the liquid-arresting space.

According to a third aspect of the present invention, in the first or second aspect of the present invention, a pressure applied to the liquid material when the liquid material is initially introduced to the screw insertion bore is set to be lower than a pressure applied during discharge of the liquid material.

According to a fourth aspect of the present invention, in any one of the first to third aspects of the present invention, the liquid material supply port is disposed at a position opposed to the spiral blade.

According to a fifth aspect of the present invention, in any one of the first to fourth aspects of the present invention, an axial distance of the liquid-arresting space is twice or more a blade pitch.

According to a sixth aspect of the present invention, in any one of the first to fifth aspects of the present invention, when the liquid material is not discharged, the screw is reciprocally rotated through an equal angle in each of forward and backward directions, thereby agitating the liquid material in the screw insertion bore.

According to a seventh aspect of the present invention, in any one of the first to sixth aspects of the present invention, the screw is made up of a smaller-diameter portion provided with the helical blade and a larger-diameter portion connected to the smaller-diameter portion.

According to an eighth aspect of the present invention, in any one of the first to seventh aspects of the present invention, the liquid-arresting space has a diameter increasing portion positioned adjacent to the sealing member.

According to a ninth aspect of the present invention, in any one of the first to eighth aspects of the present invention, the diameter increasing portion is formed in a conical shape.

A tenth aspect of the present invention resides in a viscous liquid material discharging apparatus comprising a screw having a helical blade which is axially provided over a surface of a rod-like member, a rotation driving mechanism for rotating the screw, a main body having a screw insertion bore in which the screw is inserted, a liquid material supply port formed in a lateral side of the screw insertion bore, and a liquid material supply flow passage communicating with the liquid material supply port, a sealing member which is disposed in the screw insertion bore and through which the screw penetrates, and a nozzle mounted to the main body and communicating with the screw insertion bore, wherein the screw insertion bore includes a liquid-arresting space formed above the liquid material supply port.

According to an eleventh aspect of the present invention, in the tenth aspect of the present invention, the viscous liquid material discharging apparatus further comprises a pressure control device for controlling a pressure applied to the liquid material.

According to a twelfth aspect of the present invention, in the tenth or eleventh aspect of the present invention, the liquid material supply port is disposed at a position opposed to the spiral blade.

According to a thirteenth aspect of the present invention, in any one of the tenth to twelfth aspects of the present invention, an axial distance of the liquid-arresting space is twice or more a blade pitch.

According to a fourteenth aspect of the present invention, in any one of the tenth to thirteenth aspects of the present invention, the rotation driving mechanism is able to reciprocally rotate the screw through an equal angle in each of forward and backward directions.

According to a fifteenth aspect of the present invention, in any one of the tenth to fourteenth aspects of the present invention, the main body is formed as an integral unit.

According to a sixteenth aspect of the present invention, in any one of the tenth to fifteenth aspects of the present invention, the liquid-arresting space has a diameter increasing portion positioned adjacent to the sealing member.

According to a seventeenth aspect of the present invention, in any one of the tenth to sixteenth aspects of the present invention, the screw is made up of a smaller-diameter portion provided with the helical blade and a larger-diameter portion connected to the smaller-diameter portion.

According to an eighteenth aspect of the present invention, in any one of the tenth to seventeenth aspects of the present invention, the diameter increasing portion is formed in a conical shape.

Effect of the Invention

With the present invention, generation of the problem of wear of the sealing member due to the friction can be minimized.

Also, a rotational force required for discharging a highly-viscous liquid material can be minimized.

DESCRIPTION OF REFERENCE CHARACTERS

Figure 1:
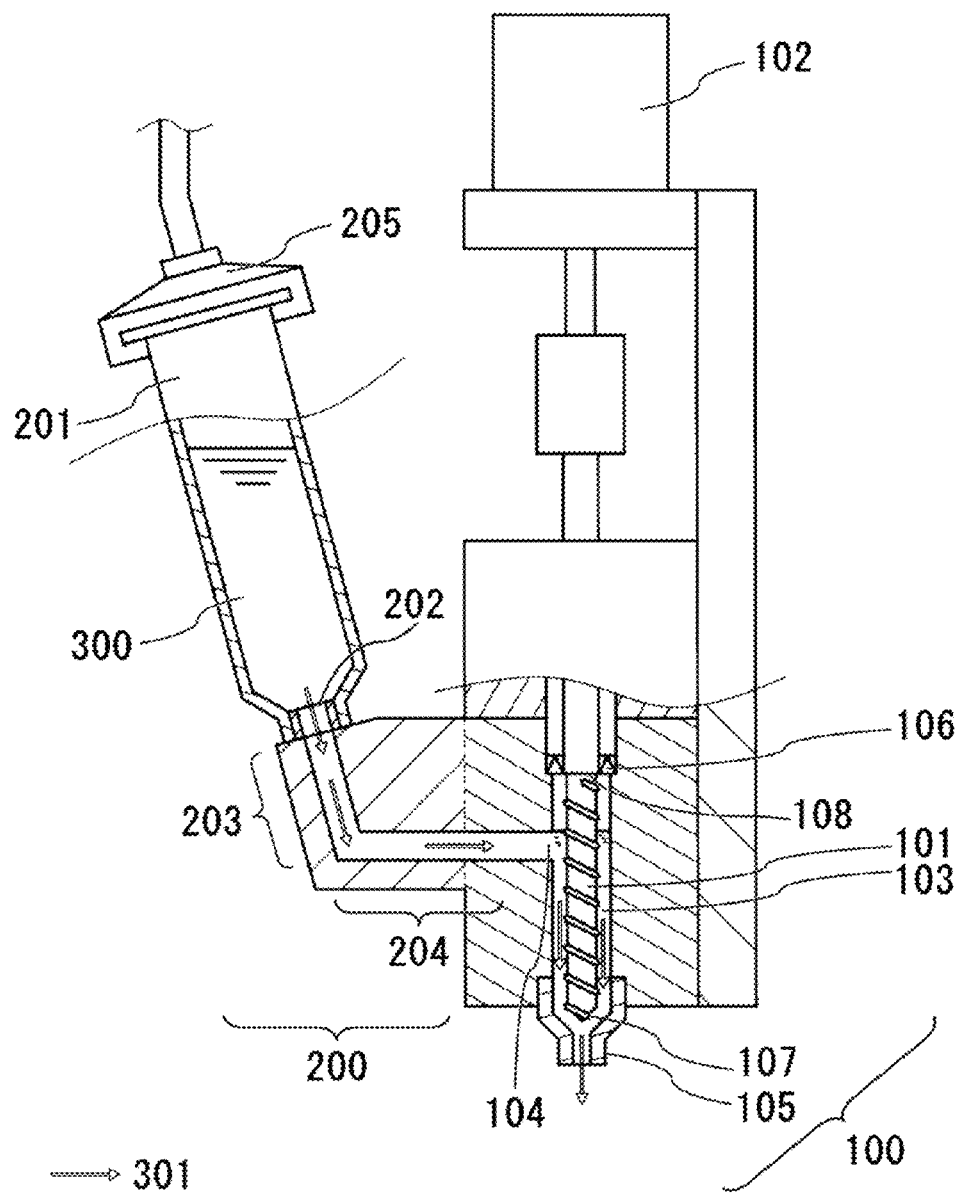
FIG. 1 is a partially sectioned schematic view for explaining a viscous liquid material discharging apparatus according to Embodiment 1.

A legend of main reference characters used in the drawings is as follows:

100 main body/101 screw/102 rotation driving mechanism (motor)/103 screw insertion bore/104 liquid material supply port/105 nozzle/106 sealing member/107 screw distal end/108 screw proximal end/109 blade/110 range in which the blade is provided/111 liquid-arresting space/112 diameter increasing portion/113 blade pitch (distance between adjacent blade edges)/114 larger-diameter member/200 connecting flow passage/201 reservoir (syringe)/202 reservoir mount port/203 first flow passage/204 second flow passage/205 adaptor tube/300 liquid material/301 flow of liquid material/400 discharging apparatus/401 dispense controller/402 motor driving device/403 compressed gas source/404 pressure control device/405 control unit

BEST MODE FOR CARRYING OUT THE INVENTION

A viscous liquid material discharging apparatus in the best mode for carrying out the present invention is featured in a viscous liquid material discharging apparatus comprising a screw having a helical blade which is axially provided over a surface of a rod-like member, a rotation driving mechanism for rotating the screw, a main body having a screw insertion bore in which the screw is inserted, a liquid material supply port formed in a lateral side of the screw insertion bore, and a liquid material supply flow passage communicating with the liquid material supply port, a sealing member which is disposed in the screw insertion bore and through which the screw penetrates, and a nozzle mounted to the main body and communicating with the screw insertion bore, wherein the screw insertion bore includes a liquid-arresting space formed above the liquid material supply port. Preferably, the liquid material supply port is disposed at a position opposed to the spiral blade.

Also, preferably, an axial distance of the liquid-arresting space is twice or more a blade pitch. This feature is based on the following results of experiments conducted by the inventors. When the axial distance is equal to the blade pitch, the liquid material reaches the sealing member in many cases. When the axial distance is twice the blade pitch, the liquid material reaches the sealing member in some cases and does not reach there in other cases. When the axial distance is triple the blade pitch, the liquid material does not reaches the sealing member in any cases.

The above-described viscous liquid material discharging apparatus is featured in that a space ranging from the liquid material supply port to the nozzle is not formed as a flow passage fully filled with the liquid material, but part of the space is formed as a liquid-arresting space not filled with the liquid material. Such a point will be described in more detail below.

In a screw type discharging apparatus illustrated in FIG. 1, a reservoir and a nozzle are always held in a mutually communicated state. A thrust force acting on the liquid material is given by a force that is generated with rotation of a screw and with a pressure of compressed gas supplied to the reservoir. Herein, the pressure applied to the reservoir is set to such an extent that, when the screw is stopped, the liquid material flows into a screw insertion bore, but the liquid material does not leak from a distal end of the nozzle.

After passing through a liquid material supply port formed in a lateral side of the screw insertion bore, the liquid material supplied from the reservoir flows into a space (liquid-arresting space denoted by 111) in an upper portion of the screw insertion bore and a space in a lower portion thereof. At that time, a ratio between the liquid material flowing into the liquid-arresting space and the liquid material flowing into the lower space depends on flow resistances in the respective spaces (i.e., easiness of flow in the respective spaces). In other words, if the flow resistances in the lower space is larger than that in the liquid-arresting space, a proportion of the liquid material flowing into the liquid-arresting space is increased, and if the flow resistances in the liquid-arresting space is larger than that in the lower space, a proportion of the liquid material flowing into the lower space is increased.

In order to increase the flow resistances in the liquid-arresting space, it is important to keep air tightness between a sealing member and the screw. By keeping air tightness between the sealing member and the screw, as a head position of the liquid material in the screw insertion bore rises, the pressure of gas in the liquid-arresting space is increased so as to produce a force acting to suppress a further rise of head position of the liquid material.

More preferably, a pressure applied to the reservoir when the liquid material is initially introduced to the screw insertion bore is set to be as low as possible to such an extent that the liquid material is allowed to flow into the screw insertion bore. Stated another way, in view of that the flow resistances in the space below the liquid-arresting space is low when the liquid material is initially introduced, the pressure applied to the reservoir is preferably set to be lower than at least a pressure applied during discharge of the liquid material for the purpose of reliably preventing the sealing member from being wetted with the liquid material.

In the case of the liquid material having high viscosity, preferably, the rotation driving mechanism reciprocally rotates the screw through an equal angle in each of forward and backward directions. By always agitating the liquid material to keep it in a flow state, the necessity of applying a large force at the time of starting the liquid material to flow can be eliminated even when the liquid material is highly viscous, and a motor having an output smaller by one rank can be used.

Also, the main body is preferably formed as an integral unit. The reason is that, by forming the main body as an integral unit, it is possible to reduce the number of components contacting the liquid material, to reduce the number of locations where the sealing members are disposed, and hence to reduce the number of replacements of the sealing member, which is a consumable part, and the number of man-hour required for the replacements.

Further, the liquid-arresting space preferably has a diameter increasing portion positioned adjacent to the sealing member.

The meaning of providing the diameter increasing portion resides in widening a clearance between the screw and an outer periphery of the liquid-arresting space. If such a clearance is narrow, the liquid material in the screw insertion bore may rise through the clearance due to a capillary phenomenon. Widening the clearance can effectively prevent a rise of the liquid material.

Still further, the diameter increasing portion is preferably formed in a conical shape or in a shape of a deep dish so that the liquid material having risen through the clearance is caused to effectively flow down.

In addition, the screw is preferably made up of a smaller-diameter member provided with the helical blade and a larger-diameter member connected to an upper end of the smaller-diameter member in order to provide a wide clearance between the screw and the outer periphery of the liquid-arresting space. The larger-diameter member and the smaller-diameter member are preferably formed as an integral unit.

The viscous liquid material discharging apparatus of the present invention can discharge various kinds of viscous liquid materials, e.g., liquid materials with viscosity of several hundreds centipoises to several millions centipoises, by adjusting parameters such as the spacing between the screw and a housing, the pitch of teeth (grooves) of the screw, the nozzle diameter, and the nozzle length. Thus, since the liquid material can be avoided from entering a gap between the sealing member and the screw in the discharging apparatus of the present invention, the present invention can also be suitably applied to discharging of the liquid material having low viscosity. In addition, since the present invention is featured in keeping the liquid material from contacting the sealing member, the present invention can be further suitably applied to discharging of the liquid materials having a variety of viscosity.

Details of the present invention will be described below in connection with embodiments, but the present invention is in no way restricted by the following embodiments.

Embodiment 1

Embodiment 1 relates to a screw type discharging apparatus for discharging a liquid material containing a filler and having viscosity of 400,000 centipoises to 800,000 centipoises.

Figure 2:
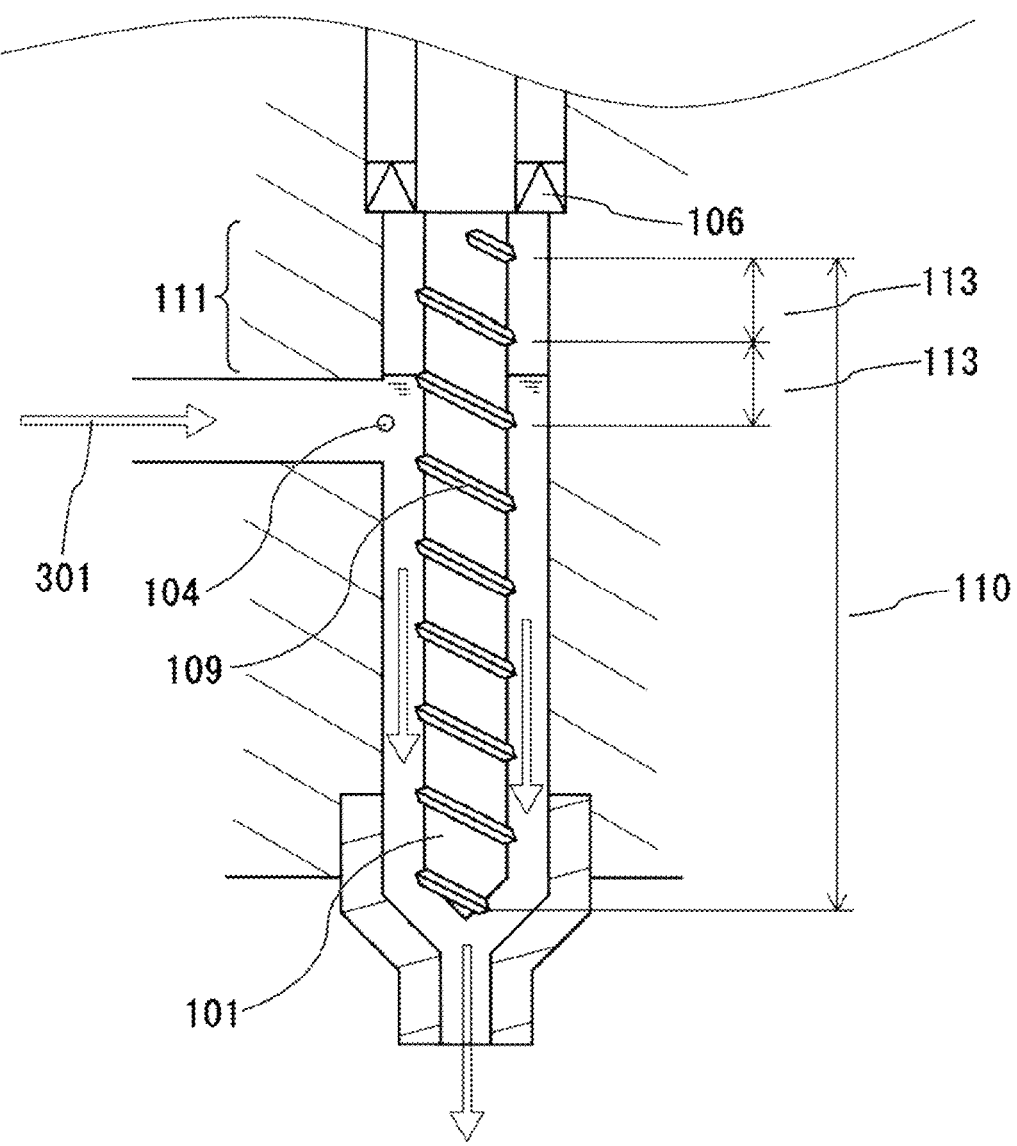
FIG. 2 is an enlarged sectional view showing a portion around a liquid material supply port in the viscous liquid material discharging apparatus according to Embodiment 1.

FIG. 1 is a partially sectioned schematic view for explaining a viscous liquid material discharging apparatus according to Embodiment 1, and FIG. 2 is an enlarged sectional view showing a portion around a liquid material supply port in the viscous liquid material discharging apparatus according to Embodiment 1. In the following, for the sake of convenience of the explanation, the side closer to a nozzle 105 is referred to as the lower side and the side closer to a motor 102 is referred to as the upper side.

The discharging apparatus of this embodiment comprises a main body 100, a screw 101 having a helical blade which is axially provided over a surface of a rod-like member, a motor 102 serving as a rotation driving mechanism to rotate the screw 101, a nozzle 105 mounted to a screw distal end 107 and communicating with a screw insertion bore 103, and a sealing member 106 through which the screw 101 penetrates.

The main body 100 is provided with the screw insertion bore 103 in which the screw 101 is inserted, a liquid material supply port 104 which is disposed in a lateral side of the screw insertion bore 103 and from which a liquid material 300 is supplied, and a connecting flow passage 200.

The connecting flow passage 200 serves as a flow passage for introducing the liquid material 300 to the liquid material supply port 104. The connecting flow passage 200 is constituted by a reservoir mount port 202 to which a syringe 201 serving as a reservoir is mounted, a first flow passage 203 communicating with the reservoir mount port 202 and inclined such that the liquid material flows in a direction toward a center axis of the screw insertion bore 103, and a second flow passage 204 which serve to communicate the first flow passage 203 and the liquid material supply port 104 of the main body 100 with each other and which is arranged such that the liquid material flows perpendicularly to the center axis of the screw insertion bore 103. In this embodiment, since the connecting flow passage 200 and the main body 100 are formed integrally with each other, the number of sealing members used is reduced to a minimum.

The syringe 201 is connected to the reservoir mount port 202. Compressed gas is supplied to the syringe 201 through an adaptor tube 205 attached to a top of the syringe 201, whereby the liquid material 300 is fed under pressure to the liquid material supply port 104 through the connecting flow passage 200. In this embodiment, the first flow passage 203 is inclined to reduce the resistance caused when the liquid material 300 is fed under pressure.

Further, in addition to the first flow passage 203, the syringe 201 attached to the reservoir mount port 202 is also inclined to increase the degree of freedom in shape of the syringe 201. For example, even the size of the syringe 201 is increased in the widthwise direction thereof, the syringe 201 in an inclined posture is less apt to interfere with the main body 100, and it is not required to increase the length of the connecting flow passage 200 to avoid the interference. In other words, since this embodiment has a structure capable of minimizing the extension of the connecting flow passage 200, which is necessarily resulted from an increase of the syringe size, an increase of the pressure required for feeding the liquid material under pressure can be held down even when the syringe size is increased.

FIG. 2 shows, in a seeing-through and enlarged way, a portion ranging from the liquid material supply port 104 to the nozzle 105. As shown in FIG. 2, the sealing member 106 is disposed at a position closer to the motor 102 than an axial range 110 of the screw in which the blade is provided.

The liquid material supply port 104 is provided in a lateral side of the screw insertion bore 103 within a range corresponding to the axial range 110 of the screw in which the blade is provided, thus forming a liquid-arresting space 111 between the liquid material supply port 104 and the sealing member 106. In this embodiment, the liquid material supply port 104 is disposed such that the axial distance of the liquid-arresting space 111, i.e., the distance between the sealing member 106 and the liquid material supply port 104, is twice or more a blade pitch 113.

Procedures for discharging the liquid material in the discharging apparatus of this embodiment will be described below.

In an discharging step, when compressed gas is supplied to the syringe 201 through the adaptor tube 205, the liquid material 300 stored in the syringe 201 is supplied to the connecting flow passage 200 through the reservoir mount port 202. Then, the liquid material 300 flows into the screw insertion bore 103 through the liquid material supply port 104.

Because the liquid material 300 flowing into the screw insertion bore 103 is pressurized by the compressed air, part of the liquid material 300 is supposed to flow upward in the screw insertion bore 103. With the provision of the liquid-arresting space 111, however, the liquid material 300 is avoided from directly reaching the sealing member 106. Further, the liquid material 300 tending to flow upward is moved downward by a blade 109 positioned above the liquid material supply port 104, whereby the liquid material 300 does not remain near the sealing member 106. Thus, in the discharging apparatus of this embodiment, since the liquid material does not reach the sealing member 106, the contact surface pressure between the sealing member 106 and the screw 101 can be reduced and the problem of wear can be suppressed to a minimum.

The liquid material 300 flowing into the screw insertion bore 103 through the liquid material supply port 104 is moved toward the screw distal end 107 while passing the screw insertion bore 103 with rotation of the screw 101 which is rotated by the motor 102, and is then discharged from the nozzle 105 mounted to a lower end of the screw insertion bore 103.

The above-described flow of the liquid material 300 from the syringe 201 to the nozzle 105 is as per indicated by arrows 301 in FIG. 1.

At the end of the discharge, the rotation of the motor 102 is stopped to stop the rotation of the screw 101. Further, by stopping the supply of the compressed gas that is supplied to the syringe 201, the discharge can be brought to an end.

After the end of the discharging step, a standby step of waiting for the start of a next discharging step is continued for a certain time in some cases. In the standby step, a reciprocally rotating operation of rotating the screw 101 in the forward and backward directions through small amounts is preferably repeated to agitate the liquid material 300 in the screw insertion bore 103 at all times. By agitating the liquid material to keep it in a flow state at all times, it is possible to eliminate the need of applying a large force at the start of causing the liquid material to flow even when the liquid material is highly viscous. The amount through which the screw 101 is reciprocally rotated can be set to such an amount that the liquid material 300 does not drip from the nozzle 105. Based on experiments, it is confirmed that a satisfactory result is obtained by setting the amount of rotation of the screw to 1/12-1/2 rotation (30 degrees to 180 degrees) or below. In the standby step, as a matter of course, the compressed gas is not supplied to the syringe 201.

Additionally, the reciprocally rotating operation of the screw 101 may be started at once without completely stopping the rotation of the screw 101 at the end of the discharge.

Figure 3:
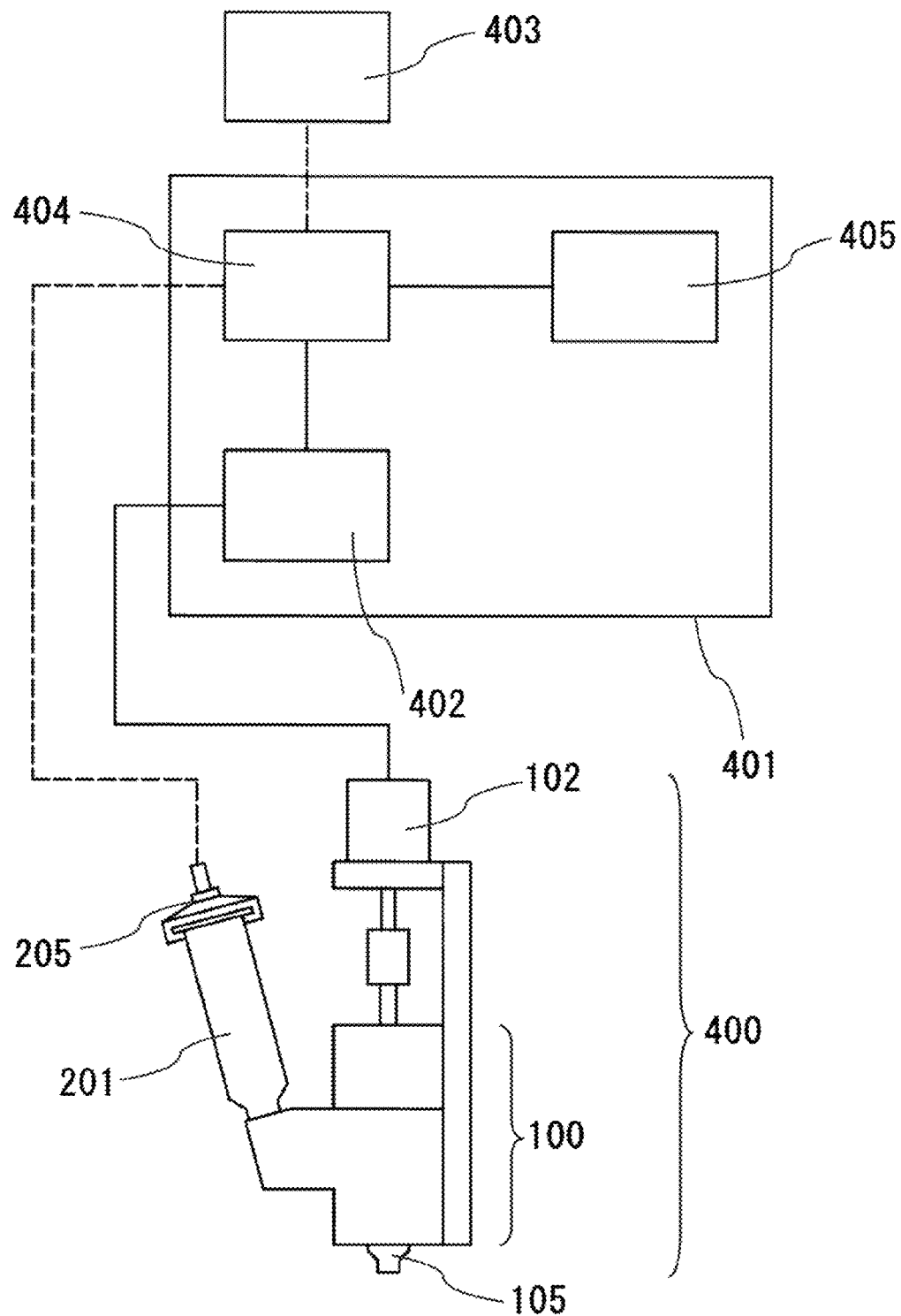
FIG. 3 is an overall schematic view of the viscous liquid material discharging apparatus according to Embodiment 1.

FIG. 3 is a schematic view of control unit in the viscous liquid material discharging apparatus according to Embodiment 1.

A dispense controller 401 for controlling an discharging apparatus 400 comprises a motor control device 402 for controlling driving of the motor 102, a pressure control device 404 for controlling the compressed air supplied from a compressed gas source 403 to the syringe 201 through the adapter tube 205, and a control unit 405 for controlling those two control devices, i.e., the motor control device 402 and the pressure control device 404.

In the discharge step, the motor control device 402 performs control to start the rotation of the motor 102, thus rotating the screw 101 with the rotation of the motor 102, and the pressure control device 404 performs control to supply the compressed gas from the compressed gas source 403 to the syringe 201 through the adapter tube 205, thus pressurizing the liquid material 300 in the syringe 201. With those two operations, the liquid material 300 is discharged from the nozzle 105. Those two control devices are controlled by the control unit 405 in the dispense controller 401. The control unit 405 can regulate the motor control device 402 and the pressure control device 404 so that an optimum discharge state is obtained depending on the viscosity and the kind of the liquid material 300.

At the end of the discharge, the rotation of the motor 102 is stopped by the motor control device 402, and the supply of the compressed gas to the syringe 201 is stopped by the pressure control device 404.

In the discharging standby step, the motor control device 402 performs the reciprocally rotating operation of rotating the motor 102 in the forward and backward directions through small amounts without performing the supply of the compressed gas to the syringe 201 by the pressure control device 404.

Embodiment 2

Figure 4:
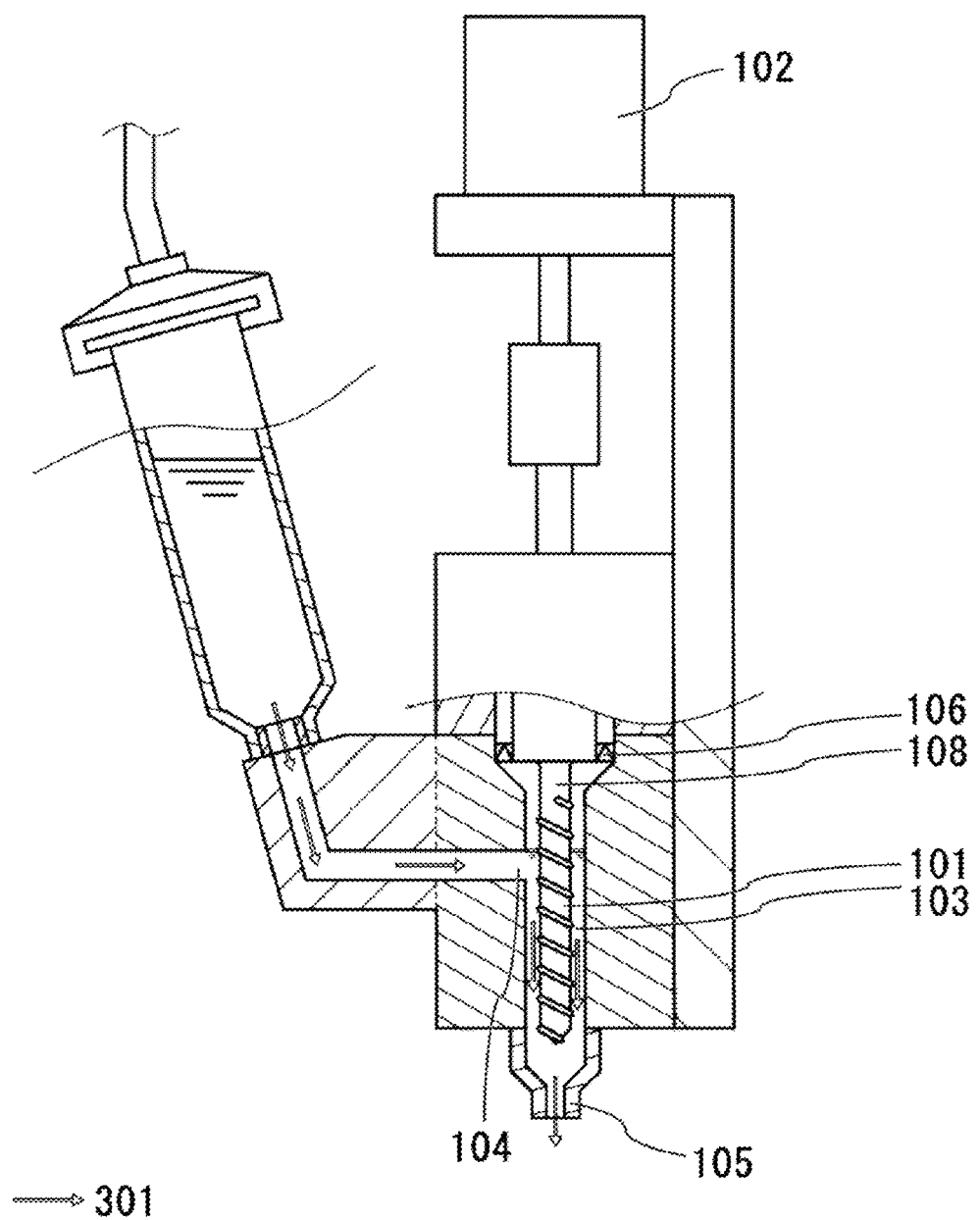
FIG. 4 is a partially sectioned schematic view for explaining a viscous liquid material discharging apparatus according to Embodiment 2.
Figure 5:
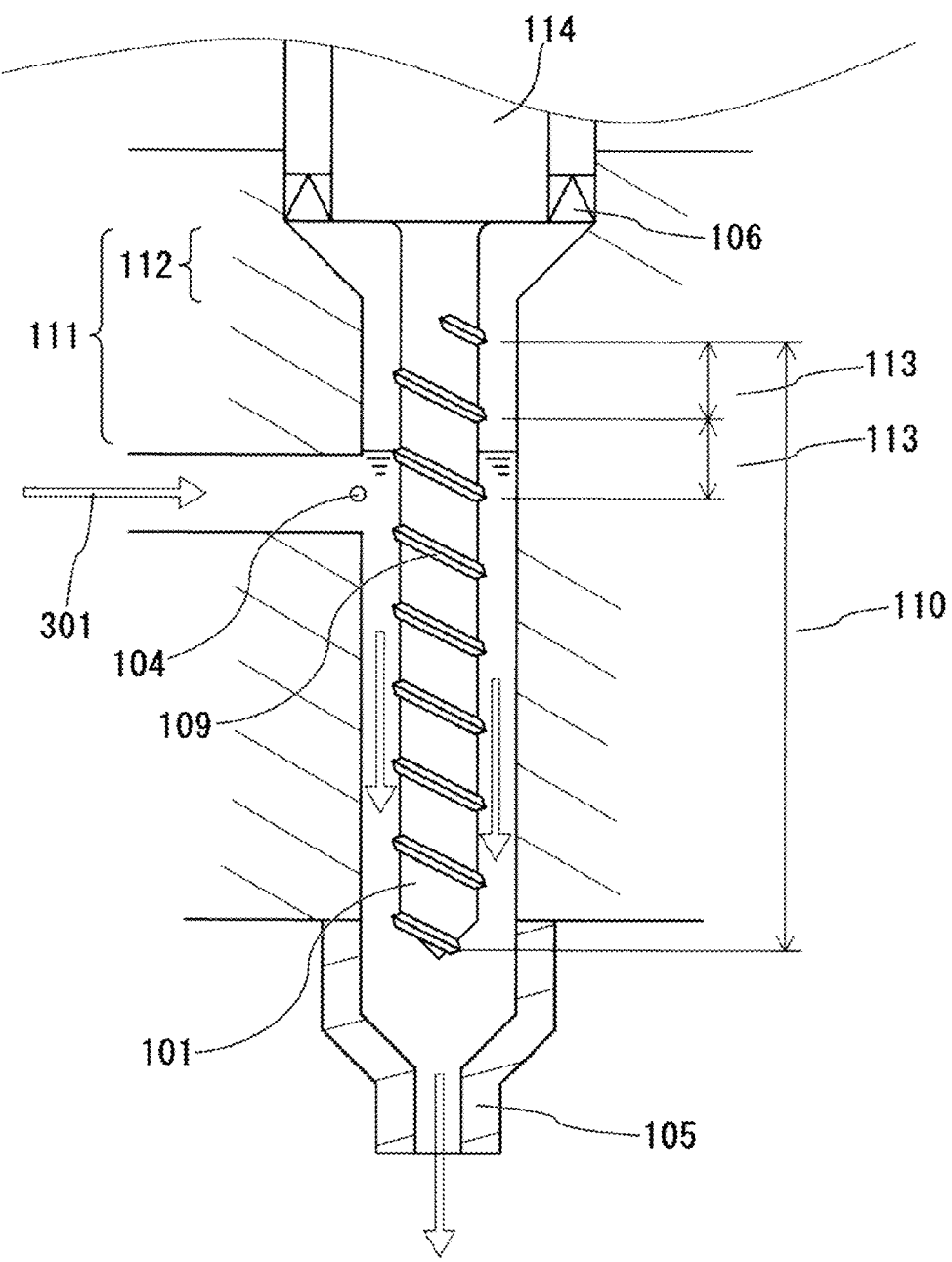
FIG. 5 is an enlarged sectional view showing a portion around a liquid material supply port in the viscous liquid material discharging apparatus according to Embodiment 2.

FIG. 4 is a partially sectioned schematic view for explaining a viscous liquid material discharging apparatus according to Embodiment 2, and FIG. 5 is an enlarged sectional view showing a portion around a liquid material supply port in the viscous liquid material discharging apparatus according to Embodiment 2. In the following, for the sake of convenience of the explanation, the side closer to a nozzle 105 is referred to as the lower side and the side closer to a motor 102 is referred to the upper side.

The discharging apparatus of Embodiment 2 differs from the discharging apparatus of Embodiment 1 in shape of the liquid-arresting space 111 and in a connecting way of a screw proximal portion 108. However, the other construction is the same.

The liquid-arresting space 111 in the discharging apparatus of this embodiment has a diameter increasing portion 112 above the liquid-arresting space 111. A lower portion of the liquid-arresting space 111 is constituted as a space having the same diameter as the screw insertion bore 103 over a certain distance, and the diameter of the liquid-arresting space 111 is gradually increased from an end of such a space up to the sealing 106. With that structure, a clearance between the screw 101 and the outer periphery of the liquid-arresting space 111 is widened near the sealing member 106 so as to effectively prevent the liquid material from rising due to a capillary phenomenon. Thus, since the diameter increasing portion 112 is formed in a conical shape, the liquid material does not remain in the diameter increasing portion 112 even if the liquid material has risen until reaching there.

Further, the screw 101 in the discharging apparatus of this embodiment is made up of a smaller-diameter member provided with the blade 109 and a larger-diameter member 114 having a larger diameter than the smaller-diameter member. With such a structure, a wider clearance can be formed near the sealing member 106 between the screw 101 and the outer periphery of the liquid-arresting space 111.

In the thus-constructed discharging apparatus of this embodiment, the liquid material can be more reliably avoided from reaching the sealing member 106.

INDUSTRIAL APPLICABILITY

The present invention relates to a method and an apparatus for discharging a viscous liquid material and a liquid material containing a filler, and the present invention can be used to discharge a creamy solder, a silver paste, a resin-based adhesive, or the like in the fields of producing, for example, semiconductor equipment and FPD (Flat Panel Display).

The invention claimed is:

1. A viscous liquid material discharging method comprising the steps of:
   preparing an apparatus comprising
      a screw having a helical blade which is axially provided with a helical pitch over a surface of a rod-like member,
      a rotation driver for rotating the screw,
      a main body having a screw insertion bore in which the screw is inserted,
      a liquid material supply port formed in a lateral side of the screw insertion bore,
      a liquid material supply flow passage communicating with the liquid material supply port,
      a sealing member which is disposed in the screw insertion bore and through which the screw penetrates, and
      a nozzle mounted to the main body and communicating with the screw insertion bore;
   forming a liquid-arresting space above the liquid material supply port in the screw insertion bore, the liquid-arresting space having a diameter increasing portion of a conical shape positioned in a state that its lower end is positioned higher than the liquid material supply port and its upper end is adjacent to the sealing member; and
   supplying the liquid material to the screw insertion bore while keeping the liquid material from contacting the sealing member, and rotating the screw in a forward direction to discharge the liquid material from the nozzle.

2. The viscous liquid material discharging method according to claim 1, wherein flow resistance in the liquid-arresting space is set to be larger than flow resistance in part of the screw insertion bore, which is positioned below the liquid-arresting space.

3. The viscous liquid material discharging method according to claim 1 or 2, wherein a pressure applied to the liquid material when the liquid material is initially introduced to the screw insertion bore is set to be lower than a pressure applied during discharge of the liquid material.

4. The viscous liquid material discharging method according to claim 1 or 2, wherein the liquid material supply port is disposed at a position opposed to the helical blade.

5. The viscous liquid material discharging method according to claim 1 or 2, wherein an axial distance of the liquid-arresting space is twice or more the helical pitch.

6. The viscous liquid material discharging method according to claim 1 or 2, wherein when the liquid material is not discharged, the screw is reciprocally rotated through an equal angle in each of forward and backward directions, thereby agitating the liquid material in the screw insertion bore.

7. The viscous liquid material discharging method according to claim 1 or 2, wherein the screw is made up of a smaller-diameter portion provided with the helical blade and a larger-diameter portion connected to the smaller-diameter portion.

8. The viscous liquid material discharging method according to claim 1, wherein air tightness is kept between the sealing member and the screw.

9. A viscous liquid material discharging apparatus comprising
   a screw having a helical blade which is axially provided with a helical pitch over a surface of a rod-like member,
   a rotation driver for rotating the screw,
   a main body having a screw insertion bore in which the screw is inserted,
   a liquid material supply port formed in a lateral side of the screw insertion bore,
   a liquid material supply flow passage communicating with the liquid material supply port,
   a sealing member which is disposed in the screw insertion bore and through which the screw penetrates, and
   a nozzle mounted to the main body and communicating with the screw insertion bore,
   wherein the screw insertion bore includes a liquid-arresting space for keeping the liquid material from contacting the sealing member, wherein the liquid-arresting space is formed above the liquid material supply port, wherein the liquid-arresting space has a diameter increasing portion of a conical shape positioned in a state that its lower end is positioned higher than the liquid material supply port and its upper end is adjacent to the sealing member.

10. The viscous liquid material discharging apparatus according to claim 9, further comprising a pressure control device for controlling a pressure applied to the liquid material.

11. The viscous liquid material discharging apparatus according to claim 9 or 10, wherein the liquid material supply port is disposed at a position opposed to the helical blade.

12. The viscous liquid material discharging apparatus according to claim 9 or 10, wherein an axial distance of the liquid-arresting space is twice or more the helical pitch.

13. The viscous liquid material discharging apparatus according to claim 9 or 10, wherein the rotation driver is able to reciprocally rotate the screw through an equal angle in each of forward and backward directions.

14. The viscous liquid material discharging apparatus according to claim 9 or 10, wherein the main body is formed as an integral unit.

15. The viscous liquid material discharging apparatus according to claim 9 or 10, wherein the screw is made up of a smaller-diameter portion provided with the helical blade and a larger-diameter portion connected to the smaller-diameter portion.

16. The viscous liquid material discharging apparatus according to claim 9, wherein flow resistance in the liquid-arresting space is set to be larger than flow resistance in part of the screw insertion bore, which is positioned below the liquid-arresting space.

17. The viscous liquid material discharging apparatus according to claim 9, wherein air tightness is kept between the sealing member and the screw.

* * * * *